US 6,717,217 B2

(12) United States Patent
Fogel et al.

(10) Patent No.: US 6,717,217 B2
(45) Date of Patent: Apr. 6, 2004

(54) ULTIMATE SIMOX

(75) Inventors: Keith E. Fogel, Mohegan Lake, NY (US); Maurice H. Norcott, San Jose, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/341,819

(22) Filed: Jan. 14, 2003

(65) Prior Publication Data

US 2003/0139023 A1 Jul. 24, 2003

Related U.S. Application Data

(62) Division of application No. 09/861,596, filed on May 21, 2001, now Pat. No. 6,541,356.

(51) Int. Cl.$^7$ .............................................. H01L 21/76
(52) U.S. Cl. ...................................... 257/347; 257/524
(58) Field of Search ............................... 257/524, 347; 438/404, 412, 480

(56) References Cited

U.S. PATENT DOCUMENTS

| | | | |
|---|---|---|---|
| 4,749,660 A | * 6/1988 | Short et al. | 437/24 |
| 4,786,608 A | * 11/1988 | Griffith | 437/24 |
| 4,902,642 A | * 2/1990 | Mao et al. | 437/83 |
| 4,975,126 A | * 12/1990 | Margail et al. | 437/25 |
| 5,182,226 A | * 1/1993 | Jang | 438/766 |
| 5,279,978 A | * 1/1994 | See et al. | 437/59 |
| 5,288,650 A | * 2/1994 | Sandow | 437/26 |
| 5,519,336 A | * 5/1996 | Liu et al. | 324/769 |
| 5,589,407 A | * 12/1996 | Meyyappan et al. | 437/26 |
| 5,712,186 A | * 1/1998 | Thakur et al. | 438/766 |
| 5,895,252 A | 4/1999 | Lur et al. | |
| 5,930,643 A | 7/1999 | Sadana et al. | |
| 6,043,166 A | * 3/2000 | Roitman et al. | 438/766 |
| 6,090,689 A | * 7/2000 | Sadana et al. | 438/480 |
| 6,214,653 B1 | * 4/2001 | Chen et al. | 438/153 |

FOREIGN PATENT DOCUMENTS

| | | |
|---|---|---|
| EP | 0 595 233 A2 | 10/1993 |
| JP | 63 217657 | 9/1988 |

OTHER PUBLICATIONS

Wolf, S., "Silicon Processing for the VLSI ERA", vol. 2: Process Integration, 1990, pp. 72–73.

White, A.E., et al., "The role of implant temperature in the formation of thin buried oxide layers", Beam–Solid Interactions and Transient Processes Symposium, Boston, Ma, USA, Dec. 1–4, 1986, pp. 585–590, XP000922701.

* cited by examiner

*Primary Examiner*—Carl Whitehead, Jr.
*Assistant Examiner*—David S Blum
(74) *Attorney, Agent, or Firm*—Scully, Scott, Murphy & Presser; Robert M. Trepp

(57) ABSTRACT

A method of forming a silicon-on-insulator (SOI) substrate having a buried oxide region that has a greater content of thermally grown oxide as compared to oxide formed by implanted oxygen ions is provided. Specifically, the inventive SOI substrate is formed by utilizing a method wherein oxygen ions are implanted into a surface of a Si-containing substrate that includes a sufficient Si thickness to allow for subsequent formation of a buried oxide region in the Si-containing substrate which has a greater content of thermally grown oxide as compared to oxide formed by the implanted oxygen ions followed by an annealing step. The sufficient Si thickness can be obtained by (i) forming a Si layer on the surface of the implanted substrate prior to annealing; (ii) conducting a high-energy, high-dose oxygen implant to ensure that the oxygen ions are implanted a sufficient distance from the surface of the Si-containing substrate; or (iii) conducting a high-energy, low-dose oxygen implant so that less implanted oxide is present in the Si-containing substrate.

10 Claims, 6 Drawing Sheets

ULTIMATE SIMOX

CROSS RELATED APPLICATIONS

This application is a divisional of U.S. application Ser. No. 09/861,596, flied May 21, 2001 now U.S. Pat. No. 6,541,356; and this application is related to co-assigned U.S. application Ser. No. 09/861,594, filed May 21, 2001; and U.S. application Ser. No. 09/861,590, filed May 21, 2001, the entire contents of each are incorporated by reference.

FIELD OF THE INVENTION

The present invention relates to silicon-on-insulator (SOI) substrates for use in the semiconductor industry for fabricating integrated circuits (ICs), and more particularly to a separation by implantation of oxygen (SIMOX) process in which the buried oxide region is highly uniform and has thermal oxide-like qualities.

BACKGROUND OF THE INVENTION

SIMOX is a technique that is employed in fabricating SOI substrates which can be used in the manufacturing of ICs. SIMOX typically involves using high-energy ions to implant a large dose of oxygen ions beneath the surface of a bulk Si wafer. Upon high-temperature annealing, the implanted oxygen forms a continuous buried oxide (BOX) region which electrically isolates the Si at the surface (i.e., the Si superficial layer). Typically, prior art SIMOX processes have been used to fabricate SOIs with a superficial Si layer and a BOX thickness of several thousand angstroms.

Conventional SIMOX processes include one of the following methods:

(i) a high-dose oxygen implantation (greater than about $4E17$ cm$^{-2}$) step followed by annealing at temperatures of greater than about 1300° C. in an inert ambient such as Ar or $N_2$ that contains less than about 5% oxygen.

(ii) a high-dose oxygen implantation (greater than about $4E17$ cm$^{-2}$) step followed by annealing at temperatures of greater than about 1300° C. in an inert ambient such as Ar or $N_2$ that contains a much higher content of oxygen than in method (i). Typically, the oxygen content used in the annealing step in this method is between 30–40% which is employed to promote internal thermal oxidation.

(iii) Combining a base oxygen implant of greater than about $1E17$ cm$^{-2}$ and a room temperature implant (typically greater than about $1E15$ cm$^{-2}$) followed by annealing in an inert ambient that contains oxygen in a concentration range of from about 8 to about 40%. The limit on oxygen content is imposed because of the range of an oxygen beam in the Si substrate using a conventional implanter operating at a nominal energy of about 200 keV; Si thickness is less than about 4500 Å. Since greater than 4–5 hours annealing is typically required at temperatures greater than 1320° C. to achieve device quality SIMOX with desired Si thickness, the inert ambient is limited to less than 40%.

The conventional SIMOX processes mentioned above each suffer from the same problem in that the prior art SIMOX processes are incapable of forming a BOX region which is composed substantially of a thermal oxide layer, i.e., an oxide that is formed by thermal oxidation. Instead, the prior art SIMOX processes mentioned above produce BOX regions that are composed mainly of an oxide layer that is formed by implanted oxygen ions. A thermal oxide layer is preferred in the semiconductor industry over oxide layers that are formed by implanted oxygen ions because thermal oxides have fewer defects, have a sharper Si/BOX interface and are of higher quality (in terms of both structural and electrical quality) as compared with an oxide layer formed by implanted oxygen ions.

In view of the drawbacks mentioned above with prior art SIMOX processes, there is a continued need for developing a new and improved SIMOX process that is capable of forming a BOX region which is composed substantially of a thermal oxide layer.

SUMMARY OF THE INVENTION

One object of the present invention is to provide a method of forming a BOX region in a Si-containing substrate in which the BOX region is composed substantially of a thermal oxide layer.

A further object of the present invention is to provide a method of forming a BOX region in a Si-containing substrate that exhibits improved structural qualities as well as electrical qualities as compared to BOX regions that are formed using conventional SIMOX processes.

A yet further object of the present invention is to provide a method of forming a BOX region in a Si-containing substrate in which substantially little or no divot defects are formed in the final SOI substrate.

A still further object of the present invention is to provide a method of forming a BOX region which has a substantially uniform interface with the superficial Si-containing layer that is formed on top of the BOX region.

These and other objects and advantages are achieved in the present invention by utilizing a method which ensures that there is sufficient Si thickness present during the entire SIMOX process such that internal thermal oxide growth caused during the annealing step is enhanced. By enhancing the internal thermal oxide growth, a BOX region containing a greater content of thermal oxide as compared to oxide formed by implanted oxygen ions is formed.

Specifically, the present invention provides a SIMOX process which comprises the steps of:

(a) implanting oxygen ions into a surface of a Si-containing substrate, said Si-containing substrate including a sufficient Si thickness to allow for subsequent formation of a buried oxide region in the Si-containing substrate which has a greater content of thermally grown oxide as compared to oxide formed by implanted oxygen ions; and (b) annealing the Si-containing substrate containing said implanted oxygen ions under conditions that are effective in forming said buried oxide region containing said greater content of thermally grown oxide as composed to oxide grown by said implanted oxygen ions.

It is noted that the term "Si-containing substrate" as used herein denotes semiconductor substrates such as Si, SiGe, SiC, SiGeC, Si/SiC, Si/SiGe as well as patterned or unpatterened preformed silicon-on-insulators (SOIs) which include a single or multiple buried oxide regions formed therein.

Because the method of the present invention forms a buried oxide region having a greater content of thermal oxide as compared to oxide formed by implanted oxygen, the inventive method is referred to herein as the ultimate SIMOX process.

In accordance with a first embodiment of the present invention, sufficient Si thickness is maintained during steps (a) and (b) by forming a Si layer atop of the Si-containing substrate. In this embodiment of the present invention, the Si layer is formed atop the Si-containing substrate after implanting the wafer with oxygen ions, but prior to annealing. The implant in this embodiment is carried out using a low-dose oxygen implant step and annealing is carried out at high-temperatures in an ambient that includes from about 0.1 to about 100% oxygen and from about 0 to about 99.9% of an inert gas.

In accordance with a second embodiment of the present invention, the sufficient Si thickness is maintained by conducting a high-energy, high-dose oxygen implant to ensure that the oxygen ions are implanted a sufficient distance from the surface of the Si-containing substrate. Annealing is carried out at high-temperatures in an ambient that includes from about 0.1 to about 100% oxygen and from about 0 to about 99.9% of an inert gas.

In a third embodiment of the present invention, the buried oxide region having a greater content of thermal oxide as compared to oxide formed by ion implantation is carried out using a high-energy, low-dose oxygen implant step. Using a high-energy, low-dose implant process provides less implanted oxygen therefore allotting for a greater growth of thermal oxide. In this embodiment, annealing is carried out at high-temperatures in an inert gas atmosphere that includes from about 0.1 to about 100% oxygen and from about 0 to about 99.9% of an inert gas.

Notwithstanding which of these embodiments is employed, the implanting of oxygen ions in step (a) may be carried out using a single ion implantation step or multiple ion implantation steps such as a base oxygen implant followed by a low-temperature ion implant may be employed.

Another aspect of the present invention relates to SOI substrates that are formed utilizing the above-mentioned ultimate SIMOX process. Specifically, the inventive SOI substrate comprises:

a buried oxide region that is sandwiched between a top superficial Si-containing layer and a bottom Si-containing layer, wherein said buried oxide region has a greater content of thermally grown oxide as compared to oxide formed by implanted oxygen ions and said buried oxide region includes an interface that is uniform with said top superficial Si-containing layer.

Because of the increased content of thermally grown oxide, the buried oxide regions of the present invention exhibit high structural as well as electrical qualities as compared to buried oxide regions formed using conventional ion implantation.

The term "high structural quality" is used herein to denote a SOI substrate which has little or no etch pitch density (less than about $1 \times 10^5$ cm$^2$); little or no top or bottom Si/buried oxide interface roughness (interface roughness of less than about 100 Å as measured by TEM (transmission electron microscopy)); a low HF-defect density (less than about 1 cm$^2$); and a low surface roughness (of about 6 Å root mean square).

The term "high electrical quality" is used herein to denote a structure wherein the buried oxide breakdown field is high (greater than about 6 megavolts per cm); the buried oxide minibreakdown voltage is high (greater than about 50 volts); the buried oxide leakage at a given voltage is low (less than about 1 nanoAmp); and the buried oxide density is low (less than about 1 cm$^{-2}$).

DETAILED DESCRIPTION OF THE INVENTION

The present invention which provides a method of forming a SOI substrate having a buried oxide region that has a greater content of thermally grown oxide as compared to oxide formed by implanted oxygen ions will now be described in more detail by referring to the following discussion as well as the drawings that accompany the present application.

Figure 1:
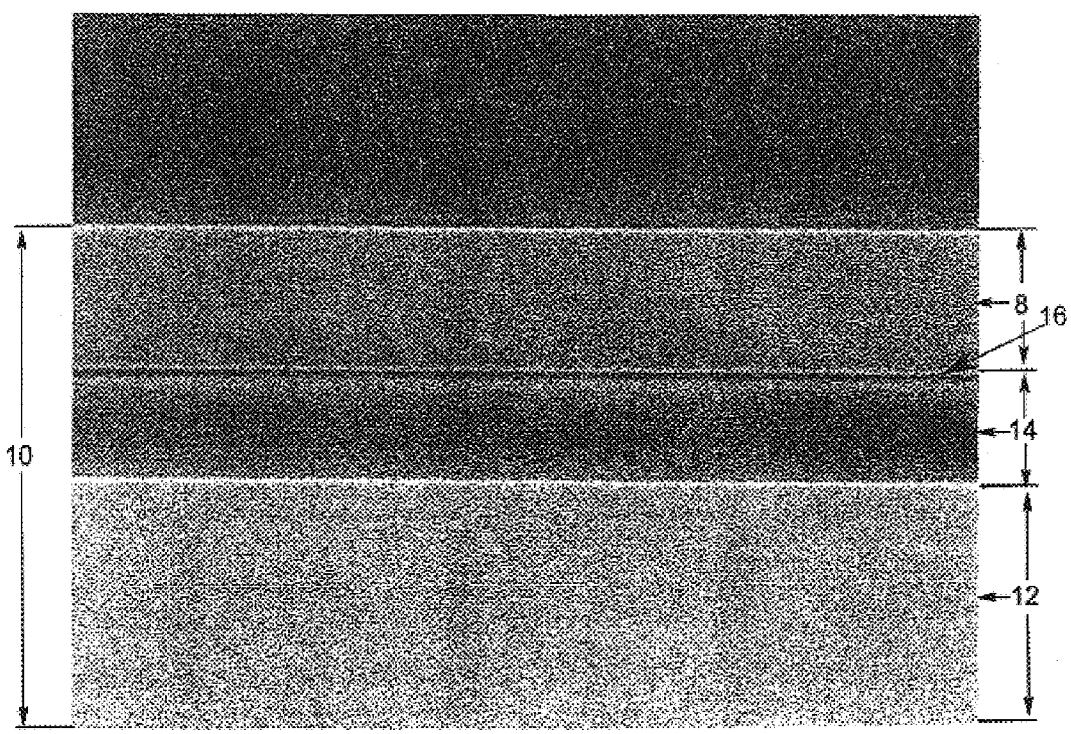
FIG. 1 is a cross-sectional view via a SEM (scanning electron microscopy) of the inventive SOI substrate.

Reference is first made to FIG. 1 which is a cross-sectional view via a SEM of the inventive SOI substrate. Specifically, the inventive SOI substrate, which is denoted in FIG. 1 by reference numeral 10, comprises buried oxide region 14 that is sandwiched between a top superficial Si-containing layer 8 and a bottom Si-containing layer 12: in the remaining text the top superfacial Si-containing layer 8 of FIG. 1 is designated by reference numeral 18. In accordance with the present invention, the buried oxide region has a greater content of thermally grown oxide as compared to oxide formed by implanted oxygen ions. Moreover, buried oxide (BOX) region 14 includes interface 16 that is uniform with the top superficial Si-containing layer. The term "uniform" is used herein to describe that the BOX region of the inventive SOI substrate is smooth, not rough as is the case in prior art SOI substrates. Note in the embodiment shown in FIG. 1, the BOX region is continuously formed throughout the entire SOI wafer. Thus, no voids exist between the BOX region and the top superficial Si-containing layer. In the embodiment shown in FIG. 2A, discrete BOX regions 14 are formed in the Si-containing substrate. Note that in FIG. 2A, reference numeral 15 denotes the thermal grown oxide layer, whereas reference numeral 13 denotes oxide formed by implanted oxygen. FIG. 2B shows another alternative SOI substrate of the present invention which was patterned prior to oxidation.

The thickness of the BOX regions formed in the present invention may vary depending upon the exact embodiment used in fabricating the same. Typically, however, the BOX region of the present invention has a thickness of from about 200 to about 5000 Å, with a thickness of from about 500 to about 2000 Å being more highly preferred.

Insofar as the top superficial Si-containing layer is concerned, that Si-containing layer may have a variable thickness which is also dependent upon the exact embodiment used in fabricating the same. Typically, however, the superficial Si-containing layer of the SOI substrate of the present invention has a thickness of from about 50 to about 5000 Å, with a thickness of from about 1000 to about 2000 Å being more highly preferred. It is noted that in some embodiments of the present invention, the superficial Si-containing layer may have a thickness that is greater than 5000 Å. This is particularly the case when the SOI substrate is to be employed as a substrate for a power supply or as a substrate in some bipolar devices. The thickness of the bottom Si-containing layer is inconsequential to the present invention.

As stated above, the inventive SOI substrate contains a BOX region that has substantially more thermal oxide as compared to oxide formed by implanted oxygen ions. That is, the inventive SOI substrate contains a BOX region which is composed of greater than 50% thermal oxide, the remainder is oxide formed by implanted oxygen ions. More preferably, the inventive SOI substrate contains a BOX region which is composed of from about 60 to about 75% thermal oxide and from about 25 to about 40% oxide formed by implanted oxygen ions.

Because of the greater content of thermal oxide as compared to oxide formed from implanted oxygen ions, the inventive SOI substrate exhibits the above mentioned structural and electrical properties which are an improvement over SOI substrates formed using conventional SIMOX processes.

Figure 2A:
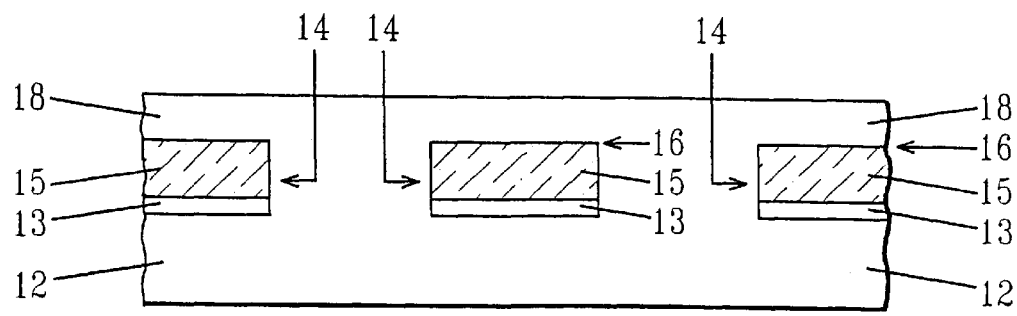
FIGS. 2A–B are pictorial representations (through cross-sectional views) showing alternative SOI substrates that can be formed in the present invention.
Figure 2B:
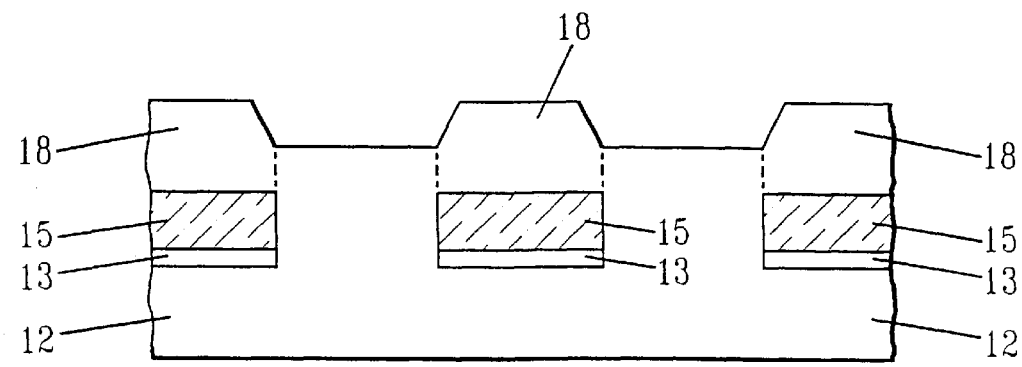

The SOI substrate shown in FIG. 1 or FIGS. 2A–B can be used in forming high-performance semiconductor devices or circuits. Examples of such devices or circuits that can contain the SO substrate of the present invention include, but are not limited to: microprocessors, memory cells such as dynamic random access memory (DRAM) or static random access memory (SRAM), application specific integrated circuits (ASICs), optical electronic circuits, and larger and more complicated circuits. Since these device or circuits are well known in the art, it is not necessary to provide a detail description concerning the same. It is however emphasized that the active devices and/or circuits are typically formed in the top superficial Si-containing layer, i.e., layer 18 in FIG. 1 or FIGS. 2A–B.

The method used in forming the inventive SOI substrate will now be described in greater detail. Broadly speaking, the inventive method includes the steps of implanting oxygen ions into a surface of a Si-containing substrate, the Si-containing substrate including a sufficient Si thickness to allow for subsequent formation of a buried oxide region in the Si-containing substrate which has a greater content of thermally grown oxide as compared to oxide formed by implanted oxygen ions; and annealing the Si-containing substrate containing said implanted oxygen ions under conditions that are effective in forming said buried oxide region containing said greater content of thermally grown oxide as composed to oxide grown by said implanted oxygen ions.

It is noted that the inventive method may work using conventional SIMOX implants and annealing provided that there is sufficient Si present during the entire SIMOX process. Thus, for example, the ion implantation and annealing conditions described in co-assigned U.S. Pat. No. 5,930,643 to Sadana, et al.; U.S. Pat. No. 6,043,166 to Roitman, et al.; and U.S. Pat. No. 6,090,689 to Sadana, et al., the entire contents of each of which is incorporated herein by reference, may be employed provided that one maintains sufficient Si throughout the entire SIMOX process.

The term "sufficient Si thickness" as used herein denotes an amount of Si (either bulk Si and/or a Si layer formed on the bulk substrate) that is required to allow for the growth (via predominately thermal oxidation) of a BOX region that contains substantially more thermal oxide as compared with oxide formed by implanted ions, while leaving a desired thickness of the superficial Si-containing layer. That is, an amount of Si which will permit internal thermal oxide growth to proceed above the oxide formed by implanted oxygen. Since the thermal oxide layer grows over the oxide formed by implanted oxygen ions, the sufficient Si thickness is determined from the depth that the oxygen ions are implanted into the surface of the bulk Si-containing substrate and the final SOI thickness required.

Figure 3A:
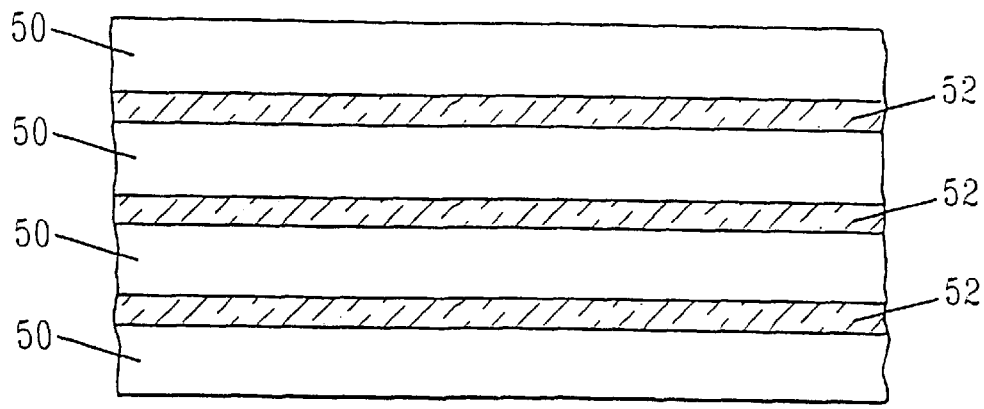
FIGS. 3A–C are pictorial representations (through cross-sectional views) of various preformed SOI substrates that can be employed in the present invention.
Figure 3B:
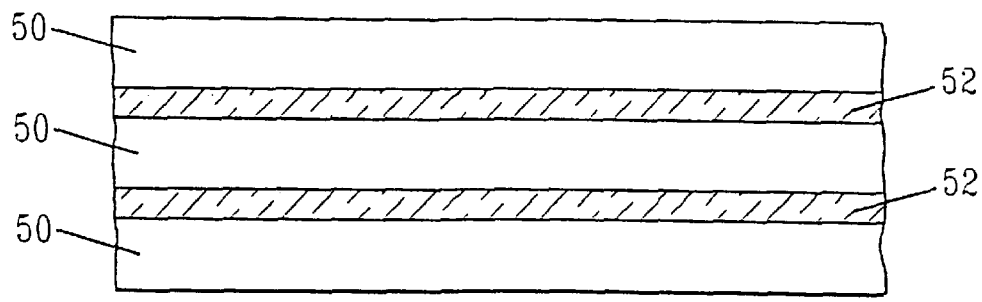
Figure 3C:
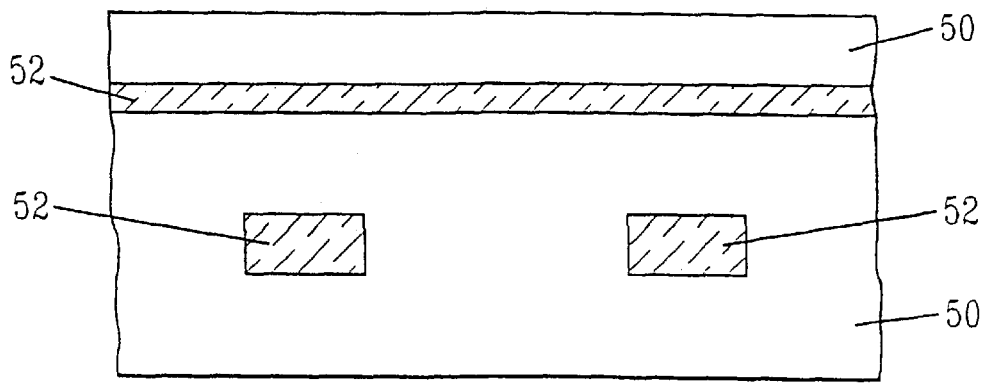

The term "Si-containing substrate" denotes any semiconducting substrate that includes Si therein including, but not limited to: Si, SiGe, SiGeC, SiC, Si/Si, Si/SiGe and other like semiconducting substrates. The Si-containing substrate used in the present invention may be undoped or doped (p or n-type) depending on its future use. The term "Si-containing substrate" also includes patterned or unpatterned preformed silicon-on-insulators (SOIs) which include a single or multiple buried oxide regions formed therein. Various performed SOI substrates that can be employed in the present invention are shown for example in FIGS. 3A–C. In each of these figures, reference numeral 50 denotes Si-containing layers, whereas reference numeral 52 denotes buried oxide layers.

This 'sufficient thickness' of Si will vary depending upon which embodiment of the present invention is employed. Typically, however, the required Si thickness needed to form a BOX region that contains predominately more thermal oxide than oxide formed by implanted oxygen is from about 50 to about 10,000 Å above the depth of the implanted oxygen ions, with a thickness above the implanted oxygen ions of from about 100 to about 5000 Å being more highly preferred.

Figure 4A:
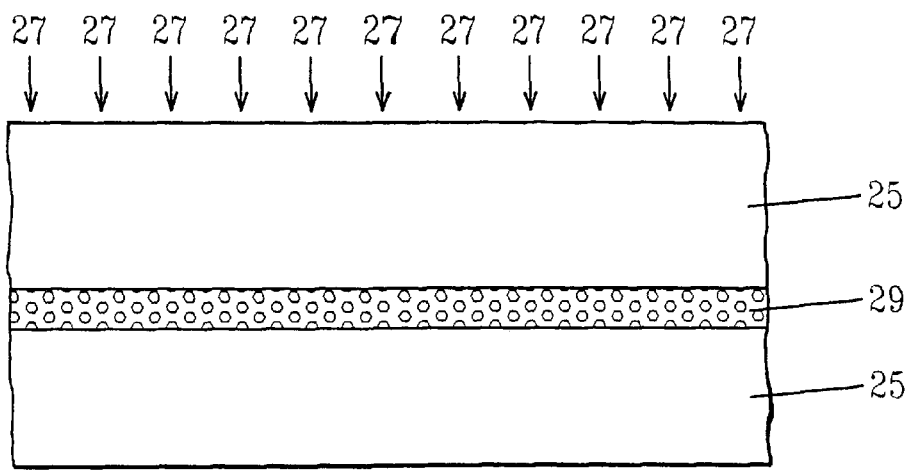
FIGS. 4A–C are pictorial representations (through cross-sectional views) showing the formation of the inventive SOI substrate through various processing steps used in the first embodiment of the present invention.
Figure 4B:
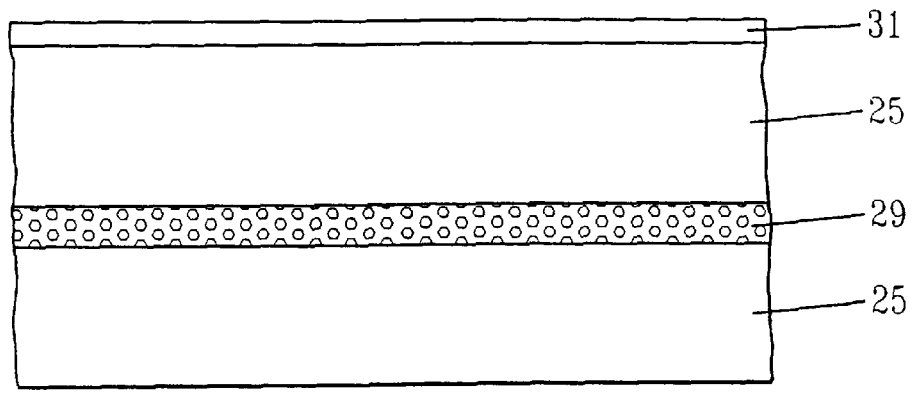
Figure 4C:
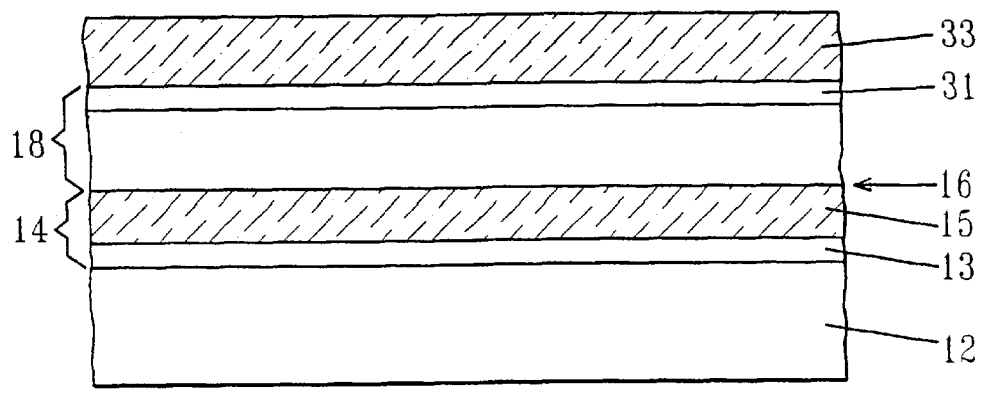

In a first embodiment of the present invention, sufficient Si thickness is maintained by forming a Si-containing layer atop of a Si-containing substrate. This embodiment of the present invention is illustrated in FIGS. 4A–C. Specifically, FIG. 4A shows a Si-containing substrate 25 being implanted with oxygen ions 27; note reference numeral 29 denotes implanted oxygen regions formed by the implant. The oxygen ions are implanted into the Si-containing substrate using a low-dose oxygen implant. The term "low-dose" as used herein for this embodiment of the present invention denotes an oxygen ion dose of about 4E17 $cm^{-2}$ or below, with an oxygen ion dose of from about 1E17 to about 3.5E17 $cm^{-2}$ being more preferred.

In addition to using low-oxygen doses, this implant is carried out in an ion implantation apparatus that operates at a beam current of from about 1 to about 100 milliamps and at energies of from about 1 to about 10,000 keV. More preferably, this implant is carried out using an energy of from about 20 to about 250 keV.

This implant, which may be referred to as a base ion implant, is carried out at a temperature of from about 100° to about 800° C., with a temperature of from about 200° to about 600° C. being more highly preferred.

Using the above parameters, the oxygen ions are implanted into the Si-containing substrate to a depth of from about 100 to about 25,000 Å, with a depth of from about 400 to about 5000 Å being more preferred. Note that the depth is measured from the top surface of the Si-containing substrate and it represents a mean value that is based upon a Gaussian distribution.

If desired, the base oxygen implant step may be followed by a second oxygen implant that is carried out using an oxygen dosage of from about 1E14 to about 1E16 $cm^{-2}$, with a dosage of from about 1E15 to about 5E15 $cm^{-2}$ being more highly preferred. The second oxygen implant is carried out at an energy of from about 1 to about 10,000 keV, with an energy of from about 20 to about 250 keV being more preferred. This second implant is performed at a temperature of from about 1 Kelvin (i.e., −272° C.) to about 200° C., with a temperature of from about 25° to about 100° C. being more preferred.

Using the above parameters, the oxygen ions in the second implantation step are implanted into the Si-containing substrate to a depth of from about 100 to about 25,000 Å, with a depth of from about 400 to about 5000 Å being more preferred. Note that the depth is measured from the top surface of the Si-containing substrate and the second oxygen implant forms an amorphous region below the damaged region caused by the base ion implant step. During the subsequent annealing, the amorphous and damaged region, are converted into a BOX region. It is noted that in FIG. 4A, reference numeral 29 denotes the implanted oxygen region (damaged or damaged/amorphous) that is formed in the Si-containing substrate during the oxygen ion implantation step.

Following the implanting of oxygen into the Si-containing substrate, Si layer 31 is formed on the surface of the Si-containing substrate prior to annealing. The Si layer employed in this embodiment of the present invention includes amorphous Si, polycrystalline Si (i.e., polySi), epitaxial Si (i.e., epi Si), defective Si containing stacking faults and microtwins or combinations and multilayers thereof. The resultant structure after forming Si layer 31 on the Si-containing substrate is shown, for example, in FIG. 4B.

In accordance with the present invention, Si layer 31 is formed on the surface of the Si-containing substrate using conventional deposition processes well known to those skilled in the art. For example, Si layer 31 may be formed by chemical vapor deposition (CVD), plasma-enhanced chemical vapor deposition (PECVD), low-pressure chemical vapor deposition (LPCVD), sputtering, evaporation and chemical solution deposition. Alternatively, the Si layer may be formed by using a conventional epitaxial growth method.

The thickness of the Si layer formed on the Si-containing substrate may vary depending upon the required thickness necessary to achieve the formation of a BOX region having the above-mentioned properties. Typically, in the present invention, Si layer 31 has a thickness of from about 50 to about 25,000 Å, with a thickness of from about 100 to about 5000 Å being more preferred.

Following application of Si layer 31 to a surface of the Si-containing substrate, the structure shown in FIG. 4B is then annealed using conditions that are effective in forming buried oxide region 14 containing a greater content of thermally grown oxide as composed to oxide grown by said implanted oxygen ions. The resultant structure after annealing is shown, for example, in FIG. 4C wherein reference numeral 15 is used to denote the thermal oxide layer of the BOX region and reference numeral 13 is used to denote the oxide layer formed by implanted ions. Note that in FIG. 4C, superficial Si-containing layer 18 may or may not include a portion of the Si-containing substrate that is not consumed during the annealing process as well as Si layer 31. Note also that oxide layer 33 forms over the superficial Si-containing layer of the inventive SOI substrate. Oxide layer 33 may be removed following annealing using a conventional etching process that is selective in removing oxide as compared to silicon. For example, HF may be used to strip the oxide layer from the surface of the SOI substrate.

The annealing step is carried out in an ambient that includes from about 0.1 to about 100% oxygen and from about 0 to about 99.9% inert gas such as He, Ar, and $N_2$. In one preferred embodiment of the present invention, Ar is employed as the inert gas.

When greater than 50% oxygen is employed, the annealing step may be referred to as an oxidation step. More preferably, the annealing step employed in this first embodiment of the present invention is carried out in an ambient that includes from about 10 to about 100% oxygen and from about 0 to about 30% inert gas. In an even more preferable embodiment of the present invention, 100% oxygen is employed.

It is noted that the exact content of oxygen used during the annealing step may vary depending upon the amount of implanted oxygen and total thickness of the Si-containing substrate and Si layer 31 that is above the implanted oxygen regions. Notwithstanding this, annealing is typically performed at a temperature of from about 1200° to about 1390° C. for a time period of from about 1 to about 500 hours. More preferably, annealing is performed at a temperature of from about 1300° to about 1350° C. for a time period of from about 2 to about 40 hours.

The annealing step may be carried out by simply heating the wafer shown in FIG. 4B at a specific ramp temperature to the targeted temperature, or various ramp and soak cycles may be employed. During the various ramp and soak cycles it is possible to vary the content of the annealing ambient within the ranges mentioned above. The parameters for the ramp and soak cycles are clearly mentioned in previously incorporated U.S. Pat. No. 5,930,643 to Sadana, et al; therefore, it is not necessary to repeat the parameters herein. Note that the parameters for the ramp and soak cycles in the '643 patent may be adjusted herein to achieved formation of the inventive SOI substrate. For example, a ramp rate (for heating and cooling) of less than about 1° C./min may be employed in the present invention.

In accordance with a second embodiment of the present invention, the sufficient Si thickness is maintained by conducting a high-energy, high-dose oxygen implant to ensure that the oxygen ions are implanted a sufficient distance from the surface of the Si-containing substrate. Annealing is carried out at high-temperatures in an ambient that includes from about 0.1 to about 100% oxygen and from about 0 to about 99.9% of an inert gas.

Figure 5A:
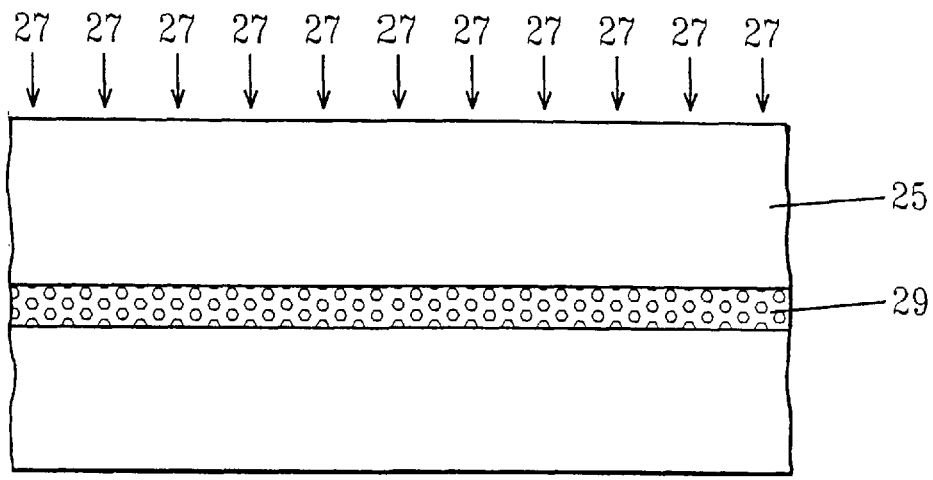
FIGS. 5A–B are pictorial representations (through cross-sectional views) showing the formation of the inventive SOI substrate through various processing steps used in the second embodiment of the present invention.
Figure 5B:
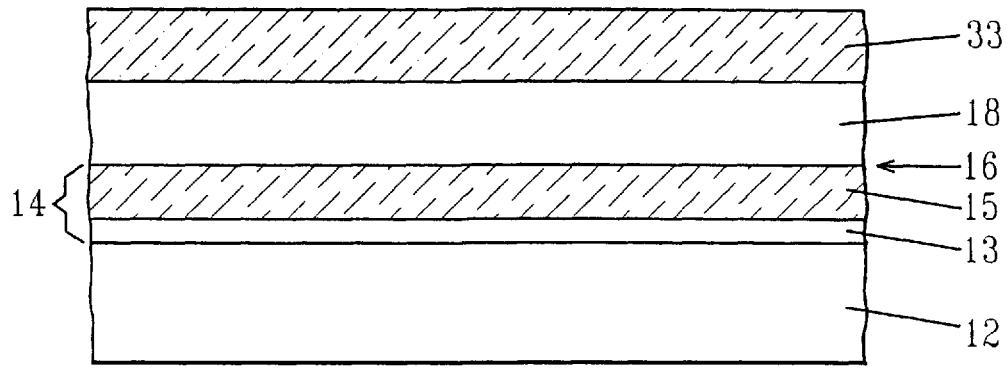

This embodiment of the present invention is shown, for example, in FIGS. 5A–B. Specifically, FIG. 5A shows Si-containing substrate 25 being implanted with oxygen ions 27. The oxygen ions are implanted into the Si-containing substrate using a high-dose/high-energy oxygen implant.

The term "high-dose" as used herein for this embodiment of the present invention denotes an oxygen ion dosage of about $4E17$ cm$^{-2}$ or greater, with an oxygen ion dose of from about $1.4E18$ to about $2E18$ cm$^{-2}$ being more preferred. The term "high-energy", on the other hand, denotes an energy from about 150 keV or greater, with an implant energy of from about 350 to about 500 keV being more highly preferred.

This implant, which may be referred to as a base ion implant, is carried out at a temperature of from about 100° to about 800° C., with a temperature of from about 200° to about 600° C. being more highly preferred.

Using the above parameters, the oxygen ions are implanted into the Si-containing substrate to a depth as stated above. Note that the depth is measured from the top surface of the Si-containing substrate and is typically greater than in the first embodiment. It is again emphasized that the depth is a mean value that is based upon a Gaussian distribution. Because high-energy implantation is employed in this embodiment of the present invention, it is generally not necessary to form a Si layer on the Si-containing substrate. The formation of a Si layer is thus optional in this embodiment of the present invention.

If desired, the base oxygen implant step may be followed by a second oxygen implant that is carried out using the conditions mentioned hereinabove During the subsequent annealing, the amorphous and damaged region, are converted into a BOX region. It is noted that in FIG. 5A, reference numeral 29 denotes the implanted oxygen region (damaged or damaged/amorphous) that is formed in the bulk Si-containing substrate during the oxygen ion implantation step.

Following the above implanting step, the structure shown in FIG. 5A is then subjected to annealing using conditions that are effective in forming buried oxide region 14 containing a greater content of thermally grown oxide as composed to oxide grown by said implanted oxygen ions. The resultant structure after annealing is shown in FIG. 5B wherein reference numeral 15 is used to denote the thermal oxide layer of the BOX region and reference numeral 13 is used to denote the oxide layer formed by implanted ions. Note that in FIG. 5B, superficial Si-containing layer 18 typically includes a portion of the Si-containing substrate that is not consumed during the annealing process and that oxide layer 33 forms over the superficial Si-containing layer of the inventive SOI substrate. Oxide layer 33 may be removed following annealing using a conventional etching process as mentioned above.

The annealing employed in this embodiment is the same as described hereinabove for the first embodiment; therefore it is not necessary to repeat the annealing conditions.

In a third embodiment of the present invention, the buried oxide region having a greater content of thermal oxide as compared to oxide formed by ion implantation is carried out using a high-energy, low-dose oxygen implant step. Using a high-energy, low-oxygen dose during the implant process provides less implanted oxygen therefore allotting for a greater growth of thermal oxide. In this embodiment, annealing is carried out high-temperatures in an inert gas atmosphere that includes from about 0.1 to about 100% oxygen and about 0 to about 99.9% of an inert gas.

In this embodiment (which is similar to the one shown in FIGS. 4A–C), a Si-containing substrate 25 is first implanted with oxygen ions. The oxygen ions are implanted into the Si-containing substrate using a high-energy, low-dose oxygen implant.

The term "low-dose" as used herein for this embodiment of the present invention denotes an oxygen ion dose of about $4E17$ cm$^{-2}$ or less, with an oxygen ion dose of from about $2E17$ to about $3.5E17$ cm$^{-2}$ being more preferred. This low-dose implant is performed at a high-energy on the order of from about 60 to about 10,000 keV, with an implant energy of from about 70 to about 250 keV being more highly preferred.

This implant, which may be referred to as a base ion implant, is carried out at a temperature of from about 100° to about 800° C., with a temperature of from about 200° to about 600° C. being more preferred.

Using the above parameters, the oxygen ions are implanted into the Si-containing substrate to a depth (mean value which is dependent upon a Gaussian curve) which is similar to that mentioned above in regard to the first embodiment of the present invention. Because a high-energy, low-dose implant is employed in this embodiment of the present invention, it is not necessary to form a Si layer on the Si-containing substrate prior to annealing. The formation of a Si layer is thus optional in this embodiment of the present invention.

If desired, the base oxygen implant step may be followed by a second oxygen implant that is carried out using the conditions mentioned above. Following the above implanting step, the structure is then subjected to annealing using conditions that are effective in forming a buried oxide region containing a greater content of thermally grown oxide as composed to oxide grown by said implanted oxygen ions. The annealing employed in this embodiment is the same as described hereinabove for the first embodiment; therefore it is not necessary to repeat the annealing conditions.

Notwithstanding which embodiment is employed in the present invention, it is possible to apply a patterned mask (e.g., photoresist or dielectric) to the surface of the Si-containing substrate prior to oxygen implantation. The application of a patterned mask to the surface of the Si-containing substrate allows for the formation of a SOI substrate which has discrete and isolated BOX regions having the properties mentioned above, i.e., a greater content of thermal oxide as compared with oxide formed by implanted oxygen ions. Such a SOI substrate is shown, for example, in FIGS. 2A–B, wherein the denoted reference numerals have the same meaning as mentioned above.

The structures shown in FIGS. 2A–B are obtained by providing a conventional mask material (photoresist or dielectric) to the surface of the Si-containing substrate, patterning the mask via conventional lithography including exposure and development and thereafter performing one of the above embodiments thereto with the patterned mask blocking portions of the Si-containing substrate. In the case of the first embodiment, the patterned resist may be formed before (FIG. 2B structure) or after application (FIG. 2A structure) of Si layer 31.

In a further embodiment of the present invention, multi-layered SOIs are provided by first conducting the above-mentioned processing steps, followed by forming an epi-Si layer on top of the superficial Si-containing layer and repeating the processing steps of the present invention. This embodiment of the present invention provides SOI structures which are similar to those depicted in FIGS. 3A–C.

Figure 6:
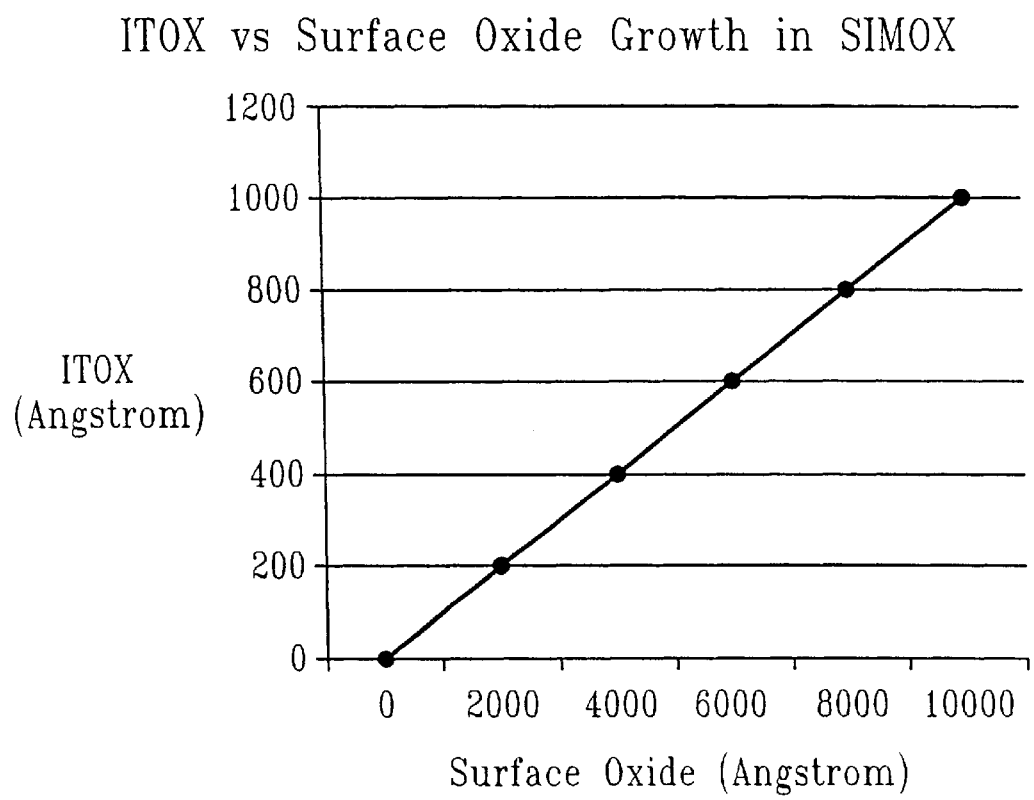
FIG. 6 is a graph of ITOX vs. surface oxide growth in SIMOX.

FIG. 6 is a graph showing internal thermal oxide growth (in Å) vs. surface oxidation (in Å). Specifically, the graph shows a direct relationship between internal oxide growth and surface oxide growth.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail what we claim as new and desire to secure by the Letters Patent is:

1. A silicon-on-insulator (SOI) substrate comprising:
   a buried oxide region that is sandwiched between a top superficial Si-containing layer and a bottom Si-containing layer, wherein said buried oxide (BOX) region has a greater content of thermal oxide as compared to implanted oxide, said thermal oxide is located atop said implanted oxide and said buried oxide region includes an interface that is uniform with said top superficial Si-containing layer.

2. The SOI substrate of claim 1 wherein said BOX region is continuous throughout said substrate.

3. The SOI substrate of claim 1 wherein said BOX region comprises discrete, isolated BOX regions formed throughout said substrate.

4. The SOI substrate of claim 1 wherein said BOX region has a thickness of from about 200 to about 5000 Å.

5. The SIO substrate of claim 4 wherein said BOX region has a thickness of from about 500 to about 2000 Å.

6. The SOI substrate of claim 1 wherein said superficial Si-containing layer has a thickness of from about 50 to about 5000 Å.

7. The SOI substrate of claim 6 wherein said superficial Si-containing layer has a thickness of from about 100 to about 2000 Å.

8. The SOI substrate of claim 1 wherein said superficial Si-containing layer includes active devices, circuits or a combination thereof.

9. The SOI substrate of claim 1 wherein said BOX region comprises greater than 50% of said thermal oxide.

10. The SOI substrate of claim 9 wherein said BOX region comprises from about 60 to about 75% of said thermal oxide.

* * * * *

UNITED STATES PATENT AND TRADEMARK OFFICE
CERTIFICATE OF CORRECTION

PATENT NO.    : 6,717,217 B2
DATED         : April 6, 2004
INVENTOR(S)   : Keith E. Fogel et al.

It is certified that error appears in the above-identified patent and that said Letters Patent is hereby corrected as shown below:

Column 1,
Line 5, "flied" should read -- filed --

Column 4,
Line 30, "12: in" should read -- 12; in --

Signed and Sealed this

Twentieth Day of July, 2004

JON W. DUDAS
*Acting Director of the United States Patent and Trademark Office*